United States Patent [19]

Aoude et al.

[11] Patent Number: 5,283,104

[45] Date of Patent: Feb. 1, 1994

[54] VIA PASTE COMPOSITIONS AND USE THEREOF TO FORM CONDUCTIVE VIAS IN CIRCUITIZED CERAMIC SUBSTRATES

[75] Inventors: Farid Y. Aoude, Wappingers; Emanuel I. Cooper, Riverdale; Peter R. Duncombe, Peekskill; Shaji Farooq, Hopewell Junction; Edward A. Giess, Purdys Station, all of N.Y.; Young-Ho Kim, Seoul, Rep. of Korea; Sarah H. Knickerbocker, Hopewell Junction, N.Y.; Friedel Muller-Landau, Putnam Valley, N.Y.; Mark O. Neisser, Wappingers Falls, N.Y.; Jae M. Park, Somers, N.Y.; Robert R. Shaw, Poughkeepsie, N.Y.; Robert A. Rita, Wappingers Falls, N.Y.; Thomas M. Shaw, Peekskill, N.Y.; Rao Vallabhaneni, Wappingers Falls, N.Y.; Jon A. Van Hise, Brookfield, Conn.; George F. Walker, New York, N.Y.; Jungihl Kim, Seoul, Rep. of Korea; James M. Brownlow, deceased, late of Norwich, Vt., by Mary Brownlow-Huessy, legal representative

[73] Assignee: International Business Machines Corporation, Armonk, N.Y.

[21] Appl. No.: 672,272

[22] Filed: Mar. 20, 1991

[51] Int. Cl.$^5$ .............................................. B32B 9/00
[52] U.S. Cl. .................................. 428/195; 428/323; 428/324; 428/325; 428/624; 428/632; 428/631; 428/612; 428/402; 428/137; 428/403
[58] Field of Search ............... 428/624, 632, 631, 612, 428/402, 137, 403, 209, 323, 324, 325, 195

[56] References Cited

U.S. PATENT DOCUMENTS

| | | | |
|---|---|---|---|
| Re. 32,107 | 4/1986 | January | 501/12 |
| 824,124 | 11/1859 | Edward | 22/4 |
| 2,267,571 | 12/1941 | McDougal | 123/169 |
| 3,508,938 | 4/1970 | Jones | 106/48 |
| 3,624,007 | 11/1971 | Meyer | 252/513 |
| 3,725,091 | 4/1973 | Chyring et al. | 106/39 DV |
| 3,794,518 | 2/1974 | Howell | 117/227 |
| 3,968,056 | 7/1976 | Bolan et al. | 252/514 |
| 4,098,949 | 7/1978 | Kosiorek | 428/434 |

(List continued on next page.)

FOREIGN PATENT DOCUMENTS

| | | |
|---|---|---|
| 186550 | 7/1986 | European Pat. Off. . |
| 212124 | 3/1987 | European Pat. Off. . |
| 332561 | 11/1988 | European Pat. Off. . |
| 0331009 | 6/1989 | European Pat. Off. . |
| 75447 | 4/1946 | Norway . |
| 824124 | 11/1959 | United Kingdom . |

OTHER PUBLICATIONS

Malliaris et al., "Influence of Particle Size on the Electrical Resistivity . . . ", *Journal of Applied Physics*, vol. 42, No. 2, Feb. 1971, pp. 614-618.

Elliot, "Phase Relationships in the Pyrometallurgy of Copper", *Metallurgical Transaction B*, vol. 7B, Mar. 1976, pp. 17-33.

(List continued on next page.)

*Primary Examiner*—Patrick J. Ryan
*Assistant Examiner*—Cathy Lee
*Attorney, Agent, or Firm*—Perman & Green

[57] ABSTRACT

Improved via-filling compositions for producing conductive vias in circuitized ceramic substrates, particularly multilayer substrates, without cracking and/or loss of hermetic sealing. The via-filling compositions comprise pastes containing a mixture of (a) ceramic and/or glass spheres of substantially- uniform diameter between about 0.5 and 6 μm, (b) conductive metal particles or spheres having a maximum dimension or diameter between about ⅓ and ¼ of the diameter of the ceramic and/or glass spheres, and (c) a binder vehicle. The formed conductive via bodies comprise a uniform conductive skeletal network of sintered metal particles densely packed within a uniform matrix of the co-sintered ceramic and/or glass spheres, which matrix is hermetically fused and integrated with ceramic layers forming the wall of the via in the ceramic circuit substrate.

31 Claims, No Drawings

U.S. PATENT DOCUMENTS

| | | |
|---|---|---|
| 4,301,324 | 11/1981 | Kumar et al. ............ 174/68.5 |
| 4,419,279 | 12/1983 | Abrams .................... 252/514 |
| 4,547,625 | 10/1985 | Tosaki ..................... 174/68.5 |
| 4,594,181 | 6/1986 | Siuta ........................ 252/512 |
| 4,598,167 | 7/1986 | Ushifusa et al. ........ 174/68.5 |
| 4,599,277 | 7/1986 | Brownlow et al. ...... 428/552 |
| 4,624,865 | 11/1986 | Gindrup et al. ......... 427/126.2 |
| 4,723,993 | 2/1988 | Kopatz et al. ........... 75/0.5 A |
| 4,756,746 | 7/1988 | Kemp et al. ............. 75/0.5 B |
| 4,773,928 | 9/1988 | Houck et al. ............ 75/0.5 R |
| 4,778,517 | 10/1988 | Kopatz et al. ........... 75/0.5 A |
| 4,818,607 | 4/1989 | Rickborn et al. ........ 428/323 |

OTHER PUBLICATIONS

Kusy, "Influence of Particle Size Ratio on the Continuity of Aggregates", *J. Appl. Phys.*, 48(12) Dec. 1977, pp. 5301–5305.

Carcia et al., "Particle Size Effects in Thick Film Resistors", *J. Appl. Phys.* 53 (7) Jul. 1982, pp. 5282–5287.

Wittmer, "Eutectic Bonding of Copper to Ceramics", *Mat. Res. Soc. Symp. Proc.*, vol. 40, 1985, pp. 393–398.

Giess et al., "Isothermal Sintering of Spheroidized Cordierite-Type Glass Powders," *Amer. Cer. Soc.* vol. 68, No. 12, Dec. 1985.

VIA PASTE COMPOSITIONS AND USE THEREOF TO FORM CONDUCTIVE VIAS IN CIRCUITIZED CERAMIC SUBSTRATES

BACKGROUND OF THE INVENTION

1. Field of the Invention

The present invention relates to improvements in conductive vias of ceramic packaging substrates. More particularly, the present invention relates to improvements in multilayer ceramic packaging substrates or bodies having vertical conductive vias which provide surface electrical interconnection with one or more internal printed circuits insulated between dielectric layers of the substrate or body. Multilayered circuitized ceramic substrates contain via-connected patterned metal layers which act as electrical conductors sandwiched between ceramic layers which act as electrical insulators. These ceramic substrates are formed by providing thin green (meaning unfired) dielectric ceramic sheets of glass particles or an admixture of glass and crystalline particles mixed With binders, with vertical via through-holes, filling such holes with conductive via-fill composition, and printing surfaces of such dielectric sheets with patterns or circuits of conductive ink containing metal particles for forming conductors between the ceramic greensheets. Said patterned and personalized greensheets are aligned, stacked in proper sequence, and then laminated with heat and pressure to form multilayer laminates. This green laminate is fired to burn off the binder materials, and to sinter the ceramic and metallic particulates into dense conductive wiring and insulating dielectric. Terms such as ceramic and glass-ceramic are often used interchangeably in the art. To avoid confusion for the purpose of this application the following definitions will be used. The term ceramic means an aggregate of randomly oriented crystalline particles, with interstices that may contain uncrystallized material such as glass or pores of void space. The terms coalescence or densification refer to a heat treatment to reduce the number and size of the pores in greensheets during processing. The term crystallization refers to the conversion of glass to crystallites upon further heating, preferably after coalescence or densification. The term sintering refers to the heat treatment required to densify the final ceramic. The term sintering temperature means, for a laminate not requiring crystallization, the coalescence temperature. Substrates made of ceramics requiring very high temperatures for particle coalescence and densification, such as alumina, restrict the choice of cosinterable conducting metallurgies to high melting point metals, for example refractory metals, such as molybdenum, tungsten, platinum, palladium or a combination of these with each other or certain other metals and preclude the use of preferable electrical conductors such as gold, silver and copper which have melting points less than the alumina sintering temperature. Alumina is a good insulator, has high thermal conductivity and has good strength. The dielectric constant of alumina is high, about 10, and results in slow electric signal propagation in circuits supported by the alumina.

Materials often referred to as glass-ceramics have been intensively studied in recent years for use as circuit substrates. These ceramics generally have a low dielectric constant, a low thermal coefficient of expansion which is close in value to silicon. and a low sintering temperature. The low sintering temperature permits the use of low melting point metals, such as copper and certain noble metals, for electrical conductors. The noble metals gold and silver have low resistivities comparable to that of copper. However, copper is less expensive and, therefore, its use substantially reduces manufacturing cost. When an oxidizable metal, such as copper, silver, molybdenum, etc., is used as the electrical conductor, it is necessary that thermoplastic organic binder materials contained within the green sheet used to form the ceramic and contained within the paste used to form the conductors be depolymerized and burned out in an atmosphere and at a temperature wherein the metal is not substantially oxidized.

Failure to burn out binders results in less than desirable ceramic properties. For example, if the binder is not fully burned out, residual carbon left in the sintered ceramic modifies the ceramic dielectric constant and inhibits complete densification. With as little as 0.1% residual carbon content the ceramic may be black, having an apparent dielectric constant greater than 1000 and, rather than being an insulator, the fired ceramic will be conductive and lossy. An at least partially oxidizing atmosphere is generally needed to burn out the binder.

Removal of the binder is complicated by the additional requirement that the burn-out ambient not excessively oxidize the oxidizable metal lines and planes. If the metal is excessively oxidized, the metal oxide can diffuse into the ceramic and change the dielectric properties of the ceramic. Also, when metal is excessively oxidized it expands causing stress within the laminate which can result in cracking of the laminate in the area of the via holes.

An additional complication is cracking, which can initiate on cooling due to the significant difference in thermal expansion coefficients (TCE) for conductors, such as copper, and glass-ceramics. In earlier molybdenum/alumina multilayer ceramics, this problem was obviated because the TCE values of the conductor and ceramic were similar. The contraction of the metal-bearing paste in the via areas causes separation from the dielectric layers and loss of the hermetic seal which is necessary to prevent porosity and leakage that allow the intrusion of post-sintering process chemicals and ambient moisture.

2. Description of the Prior Art

Reference is made to U.S. Pat. Nos. 4,547,625 and 4,598,167 for their disclosures and illustration of multilayer ceramic packaging substrates or bodies having a plurality of surface-exposed vertical conductive vias to provide interconnection between conductive areas of surface-mounted chips and different electrically-conductive line patterns or circuits printed between different dielectric layers of the structure. The ceramic compositions of these patents are low temperature softening borosilicate glasses, and the via compositions comprise a major percent by weight of conductive metal powder, i.e., between about 70% and 95% by weight copper, and a minor percent by weight of the low temperature softening glass, in order to provide bodies in which the difference between the coefficient of thermal expansion of the via composition and that of the ceramic layer composition is less than $100 \times 10^{-7}/°$ C. The objective is to produce bodies which do not crack in the via areas when the bodies are fired and thermally-cycled.

U.S. Pat. Nos. 4,098,949; 4,301,324 and 4,594,181 also disclose multilayer circuit bodies containing conductive compositions. The compositions of 4,098,949 are pastes containing 50–88 % by weight of metal powder, 2–40 % by weight of ground glass frit of silicon dioxide and other oxides, and 5–48% by weight of liquid vehicle. The glass frit is a mixture of particles up to 325-mesh (45μm) size and the metal powder is 200-mesh (75μm) size or smaller. The conductive compositions of U.S. Pat. No. 4,301,324 are pastes of conductive metal powders which are extruded into the via holes of glass-/ceramic layers which contain crystalline phases and which produce glass/ceramic bodies having a very stable thermal expansion coefficient over a wide sintering temperature range. The addition of suitable glass frits to the metal powder paste is suggested to enhance the bonding between the metal and the glass/ceramic of the dielectric circuit body.

The conductive compositions of U.S. Pat. No. 4,594,181 comprise conductive metal particles coated with certain oxides in order to modify their sintering and shrinkage properties to more closely match those of the green ceramic composition used to form the dielectric layers of the body. Copper particles or spheres having an average particle size between 0.5 and 20μm are disclosed. A process for sintering a metal member bonded to a substrate of U.S. Pat. No. 4,599,277 utilizes an organometallic compound to cause the densification temperature of the metal to be closer to that of the substrate, thereby obviating unwanted differential shrinkage rates. The ceramic/glass dielectric compositions of U.S. Pat. No. 4,301,324, discussed above, and the processes for producing multilayer interconnected thick film circuit patterns therefrom are suitable for use according to the present invention, and therefore the disclosure of U.S. Pat. No. 4,301,324 is hereby incorporated herein by reference thereto. The present invention represents an improvement over said patent with respect to the substitution of the novel conductive metal paste compositions in place of those disclosed by said Patent.

SUMMARY OF THE INVENTION

Surprisingly, applicants have discovered that by controlling the composition, constituent particle size, shape, and distribution of the conductive via paste composition, this cracking and loss of hermeticity in the via interface region between the metal and ceramic body can be eliminated. The present invention relates to improved multilayer glassceramic substrates or bodies containing interleaved circuit patterns which are interconnected to a surface of the substrate or body by means of vertical via conductors formed in-situ in via through-holes through the dielectric layers. The invention is characterized by the discovery of novel via-fill compositions which are co-sinterable with the composition of the dielectric layers, when the multilayer substrate or body is fired, and which integrate with and hermetically seal to the dielectric layers in the areas of the via passages therethrough. The present via-fill compositions have temperature coefficients of expansion and physical characteristics which avoid cracking of the dielectric layers, substrate or body, in the areas of the via holes, during firing and thermal cycling, and preclude separation and loss of seal and hermeticity during sintering or contraction.

The present via-fill compositions are composite compositions containing (a) a major amount by volume of glass-ceramic spherical particles having a relatively uniform size with a maximum diameter equal to about 10% of the diameter of the via holes to be filled therewith, and (b) a minor amount by volume of smaller particles of a conductive metal or metal alloy, preferably having a minimum surface-to-volume ratio and most preferably being spherical to control the sintering and shrinkage of both phases. The term sphere means a generally equiaxed or equidimensional shape and may include equiaxed shapes with multiple flat surfaces. The via-fill compositions are present in a flowable liquid paste containing a binder material, preferably a resinous binder material which is similar to the resinous binder material of the dielectric layer composition so as to burn off therewith during the firing of the multilayer substrate or body. The binder material, e.g., a solution of a polymer such as polyvinyl butyral in a volatile solvent is present in sufficient amount to produce a paste of the metal and ceramic-glass particles capable of flowing into and filling the via holes. Generally the paste composition comprises about 15% to 25% by weight of the organic binder system, preferably about 20% by weight (50% by volume), to provide the necessary viscosity and flow properties for filling the via holes.

The present composite via-fill compositions also preferably include a small amount of a sol-gel colloid material, preferably an aluminum compound such as alumina ($Al_2O_3$), which, although not completely understood, is believed to alter the surface activity of the conductive metal, such as copper. The colloid inhibits the Cu surface energy from pulling the minor Cu phase into isolated spheres, thus preserving the metal phase connectedness during sintering. The amount of the aluminum compound is within the range of about 300 to 2000 ppm of the paste composition, and roughly follows the practice taught in U.S. Pat. No. 4,599,277.

DETAILED DESCRIPTION OF THE INVENTION

The glass-ceramic compositions of the present invention preferably are similar to the glass-ceramic composition of the dielectric layers of the host body. Preferred glass-ceramic compositions have a low sintering temperature, below about 1000° C. and a low thermal coefficient of expansion (TCE), similar to silicon which has a TCE of $35 \times 10^{-7}$/° C. This is advantageous in the case of multilayer ceramic (MLC) substrates for surface-mounted electronic packaging devices which generally comprise silicon chips. Matched TCE properties are desirable to avoid chip separation due to different thermal expansion and contraction upon heating and cooling. Preferred glass-ceramic compositions in this respect are the cordierite glass compositions. optionally containing from 1 to 10% by volume of lower melting temperature non-cordierite glass, such glass-ceramic compositions being disclosed in U.S. Pat. No. 4,301,324, the disclosure of which is hereby incorporated by reference. Spodumene-type glass, and others related to cordierite, also may serve as base glasses.

Low sintering temperatures, below about 1000° C. and above about 850° C., are important to the process of the present invention, in cases where the preferred ceramic-glass compositions are used, since it is critical that the present composite via paste compositions co-sinter with the host body during firing thereof, and that the Cu conductor phase not melt. Such co-sintering or densification by the simultaneous coalescence of the glass-ceramic particles of the via composition and of the dielectric layers of the host body eliminates the formation of pores and cracks at the via hole interface and, in fact, eliminates the formation of a sharp interface by particle-particle integration of the via composition and the dielectric layers surrounding the via holes. Such integration, during the firing of the dielectric body, and co-sintering result in a hermetic seal between the via composition and the dielectric body in the areas of the via holes, which hermetic seal is retained as both materials shrink simultaneously and to similar extents. This is particularly true in cases where the glass-ceramic compositions of the via paste and the dielectric layers are identical, and where the via paste composition contains the largest possible amount of the glass-ceramic ingredients, i.e., 60% to about 75% by volume.

Substantial differentials between the TCE properties of the via paste composition and the dielectric layer composition can cause cracking of the dielectric body in the area of the via holes during firing of the dielectric body and/or excessive shrinking and separation of the via conductors from the dielectric body in the areas of the via holes during sintering and cooling, resulting in loss of hermeticity, leakage and strength.

The co-sintering temperature must be below the liquidus temperature of the glass-ceramic composition, which is about 1350° C. for the preferred glass-ceramic composition of the present invention, and co-sintering must be completed below its crystallization temperature, which is usually 900° to 950° C.

As mentioned supra, the incorporation of $Al_2O_3$, as a sol-gel, to the present via pastes maximizes conduction and minimizes the TCE of the formed via conductors by retarding premature densification of the metal network. This assists the formation of via conductors comprising a continuous interpenetrating skeletal network of the metal component embedded in glass-ceramic matrix. While the preferred Cu metal has a much higher TCE than the glass-ceramic composition, the composite TCE of the via conductor is substantially lower than that of the metal, per se, because the metal is contained therein in the form of an irregular, but continuous dense network, the expansion and contraction of which is absorbed and minimized by the glass-ceramic matrix within which it is encased.

Aside from the foregoing requirements, the present composite via paste compositions have certain rheological properties which have been found necessary to the formation of the continuous, dense via conductors in host bodies. Since glass-ceramic compositions have high resistive properties, and since metal particles do not form a conductive circuit unless they are in conductive contact with each other, it is necessary that the present via paste compositions are capable of flowing into and filling small via holes, and are capable of forming a surface-exposed continuous conductive metal network with the conductive lines or circuits insulated between the dielectric layers, but exposed at the via holes.

The present paste compositions preferably contain ceramic-glass particles and conductive metal particles which are both in the form of spheres. The glass-ceramic spheres are of larger, relatively uniform size so as to form a via fill which, before cosintering, comprises porous or permeable structure of contacting ceramic-glass spheres, with uniform intersticies or spaces present between the contacting surface of the glass-ceramic spheres being completely filled with smaller metal particles or spheres when the paste is deposited in the via holes. These uniform spaces are necessary in order for the smaller metal particles or spheres to permeate throughout the via paste deposited in the vias prior to or during burn-off of the organic binder, so that the conductive metal particles extend throughout the via composition in contacting relationship with each other, surrounded by the larger glass-ceramic particles during cosintering. If the sizes of via and host glass particles are too disparate, they will not co-sinter. It is also known that jagged, irregular particles sinter faster than spheres of comparable size.

The glass-ceramic particles should be relatively uniform in size, with an average size dependent upon the size of the vias to be filled and the host dielectric glass particle size. The maximum average size preferably is no greater than about 10% of the diameter of the vias to be filled, e.g., about 6μm for vias having a diameter of 60μm or less. Preferably such uniform-sized glass-ceramic particles contain no more than about 10% by weight of particles which are substantially greater or substantially smaller than the average size. The reason is that the smaller glass-cermaic spheres can flow into and plug or reduce the size of the spaces between the larger spheres, and block the penetration of the metal particles or spheres, thereby reducing the conductivity and increasing the resistively of the formed composite via conductors. Similarly, even a fraction of excessively large glass-ceramic spheres can form rigid blockages during firing and co-sintering, thereby hindering uniform shrinkage and often resulting in firing cracks.

The uniform sized glass-ceramic spheres preferably are formed according to known plasma spray techniques, such as the use of a hydrogen-argon plasma in a commercially available apparatus. Such spheres have a smooth glazed surface which facilitates dense compaction, as compared to the jagged particles with relatively rough coarse surface of ball-milled powders or frits, and which spheres facilitate the slippage of the smaller particle metal powders, preferably spheres that can be formed in the same manner as the glass-ceramic spheres, throughout the spaces between contacting surfaces of the latter within the via holes.

Earlier work (see for example R. P. Kusy in Journal of Applied Physics, vol. 48, pages 5301 to 5305, 1977) on conducting composites, of polymer and metal, containing a small volume fraction of conductor has emphasized the need for large polymer/metal particle radius ratios to promote electrical continuity. The large radius ratios are thought to promote continuity by having the small particles coat the surfaces of the large particles, not filling the voids. Large radius ratios on the order of 30:1 are thought to be most advantageous. Applicants are proposing that much smaller radius ratios in fact offer considerable advantage by promoting efficient packing that allows maximum densification and less unwanted porosity in final products. The ideal radius ratio for a sphere that will just fill the interstitial hole at the center of four tetrahedrally coordinated spheres is 0.225. Because tetrahedral sites are the dominant type of site in random close packed structures, enhanced packing is achieved when the ratio of the particle diameters is approximately this value. The metal particles or spheres need not be uniform in size, but must always be smaller than the glass spheres and should have an average diameter less than about ¼ the average diameter of the glass-ceramic particles. In compositions containing the ideal maximum volume ratio of uniformly sized glass-ceramic spheres to metal particles or spheres, the ratio of diameters is about 3:1, producing a tetrahedral close-packed alignment of the glass spheres, with the metal phase totally occupying the interstitial space between glass spheres. Thus if 6μm glass spheres are used in such ratio, the maximum metal particle or sphere diameter should be 1.35μm. The maximum diameter of the metal particles of spheres, relative to the glass-ceramic spheres, may be larger in paste compositions containing a smaller ratio of glass to metal since the glass-to-glass sphere intersticies are larger, e.g., less than about ⅓ the diameter of the glass spheres in compositions containing the minimum ratio of glass to metal spheres, i.e., about 2:1.

Since the via holes generally have diameters between about 50μm and 150μm, and since the maximum size particles have a maximum diameter equal to about 1/10 the diameter of the via holes being filled with the particular via paste, the determination of the appropriate sizes of the glass-ceramic spheres and of the metal particles or spheres will be apparent to those skilled in the art from the present disclosure. It will also be apparent that while the glass-ceramic spheres must be substantially uniform in size in order to provide a glass-ceramic network having uniform openings for penetration by the metal particles or spheres, the latter preferably include a mixture of particles of spheres including those having diameters well below the maximum permissible diameter in order to facilitate penetration of the metal particles or spheres throughout the depth of the glass sphere via-fill to fill all of the spaces or voids therein prior to co-sintering.

The inclusion of a small amount of an aluminum sol gel, such as $Al_2O_3$, and a small amount of a wetting agent, such as Ni 2-ethylhexanoate, improves the "connectedness" between the metal and glass spheres during co-sintering, thereby preventing the metal particles from coalescing into disconnected spheres. Instead, the co-sintering sphere surfaces wet and yield to each other to form a connected irregular skeletal network of metal having high conductivity, contained within the glass-ceramic matrix. The metal network is free of dense metal deposits since it is confined within the small intersticies present between contacting surfaces of the glass spheres prior to co-sintering. Thus the normally-high TCE of the metal is minimized by the absence of large metal deposits, and the stresses from expansion and shrinkage of the skeletal metal network are absorbed or distributed in the glass-ceramic matrix so as to prevent cracking of the surrounding dielectric layer wall of the via during expansion, and prevent shrink-away therefrom and disruption of the hermetic seal therebetween during cosintering. Cosintering is important between the glass spheres and the dielectric layer glass-ceramic in order to "freeze" the skeletal metal network within the glass-ceramic matrix and prevent layering or migration of either component relative to the other, and in order to fuse the glass-ceramic matrix to the glass-ceramic of the dielectric layers and form a hermetic integration therebetween, free of any sharp interface.

The present multilayer ceramic circuit substrates containing vias can be produced according to the procedure outlined in U.S. Patent 4,301,324, i.e., thin dielectric green sheets are cast, blanked with via holes having predetermined diameters and spacing, and the via holes are filled with the present via-fill paste by screen printing methods. The via-filled dielectric sheets are then surface printed with the required thin conductive circuit patterns which extend over the filled vias to produce the necessary connections therewith. The conductive circuit patterns also can be printed onto the dielectric green sheets with the present via paste compositions, but preferably they are printed with conventional conductive metal particle inks which do not contain any glass-ceramic component for internal interlayer lines. On external surfaces, such as the MLC external surfaces, the present via paste would be preferred for circuit patterns and interconnections.

The filled and printed dielectric strips or layers are then laminated in conventional manner to form multilayer green substrates or bodies which are fired in conventional manner. For example, the multilayer assembly is heated gradually to a first burn-off temperature and held at that temperature for about 30 hours in a steam and/or moist $N_2$ atmosphere to effect burn-off of the organic binder material as, for example, taught by U. S. Pat. 4,234,367. J. F. Elliot (in Metallurgical Trans. vol. 7B, 17–33, 1976) and M. Wittmer (in Electronic Packaging Materials Science, vol. 40, pages 393-8, Materials Res. Soc. Symposium Proc. 1985) have described the relevant thermodynamic relationships for copper, oxygen and oxide ceramic systems.

Then the temperature is increased gradually to a point above the glass transition temperature, held at that temperature for a period of time, and finally furnace cooled. Co-sintering occurs above the glass transition temperature, where glass mass migration and viscous flow begin. The metal particles or spheres co-sinter with the glass-ceramic and densify therewith by coalescence, co-wetting and filling any voids or pores in the via-fill and at the hole interface with the dielectric layers.

While the preferred metals for use in the present via pastes are copper, silver and gold, which co-sinter at about the same temperature as the glass-ceramic spheres and have the lowest resistivities, it is also possible to use other metals and metal alloys which also co-sinter at similar temperatures but have lower TCE properties than copper. Representative alloys are Super Nilvar (Fe-31Ni-(4-6)Co alloy, (36-37)Fe-(53-55)Co-(9-10)Cr,37Fe-30Ni-25Co-8Cr, and copper-beryllium alloys having up to substantially 2% Be by weight.

Super Nilvar alloy has a zero coefficient of expansion (TCE), and the other listed iron-cobalt alloys have exceptionally-low thermal coefficients of expansion, lower than the glass ceramic and much lower than copper and other non-resistive metals. Therefore it is possible to formulate mixtures of these iron-cobalt alloys with predetermined amounts of copper or other metals to produce a metal particle or sphere having a TCE which is closely matched to that of the glass-ceramic spheres and glass ceramic layers with which it is used. Moreover the presence of chromium in some of these alloys may increase the adhesion or connectedness of the formed metal network for the glass ceramic.

The copper-beryllium alloys also offer TCE advantages over the use of copper alone since beryllium has a substantially lower TCE than copper. Thus alloys of copper and 2% beryllium have a TCE of $7 \times 10^{-6}$, per degree centigrade which is about 50% of the TCE of copper which is $15 \times 10^{-6}$. Thus the amount of beryllium alloyed with the copper can be varied to produce an overall TCE which is closely matched to that of the glass ceramic.

The following examples illustrate specific via-fill paste compositions according to the present invention.

EXAMPLE 1

Cordierite glass spheres comprising 55wt % $SiO_2$, 20wt % MgO, 21wt % $Al_2O_3$, 3wt % $P_2O_5$ and 1wt % $B_2O_3$ are fired and sintered at a temperature below the glass melting temperature of about 1320° C. but above the crystallization temperature of 945° C. to produce a glass frit which is ground to a fine glass powder which has a 3-4μm average size with 90% by weight of the spheres being less than 9μm and 90% by weight being greater than 0.7μm in diameter.

The glass powder is spheroidized in a conventional plasma arc spraying device which melts the glass particles and sprays them into a stainless steel catch basin in predetermined relatively uniform sphere sizes. A preferred uniform sphere size corresponds to the particle sizes of the glass powder used, with no spheres being formed having a diameter greater than 20 μm. Thereafter the glass spheres are sized by screening or by air or liquid classification to remove substantially all spheres greater than about 5μm in diameter and substantially all spheres less than about 3μm in diameter.

The metal powder, comprising pure copper, is spheroidized in similar manner, using copper powder having an average particle size less than about 1μm to produce smooth copper spheres having an average diameter of about 0.7μm. The spheroidized copper is sized to remove any larger sized spheres, and the smaller copper spheres are retained. A paste is formed of a mixture of from 40 to 85 vol % of the glass-ceramic spheres with from 60 to 15 vol % of the metal spheres and 1000ppm colloidal $Al_2O_3$, which is dispersed in from 15 to 25% by weight of an organic resin binder system such as a solution of ethyl cellulose in a volatile solvent such as an ester alcohol.

The multilayered substrate fabrication process for the structures of the present invention, according to a preferred embodiment, involves the following illustrative basic steps:

Step 1

The cullet of the chosen crystallizable cordierite-type glass disclosed in U.S. Pat. No. 4,301,324 to Kumar et al. is ground to average particle sizes in the range of 2 to 7 micrometers. Spodumene-type glass, and others related to cordierite, could serve as base glasses also. The grinding can ba done in two steps, a preliminary dry or wet grinding to 400 mesh (37μm) particle size followed by further grinding with suitable organic binders and solvents until the average particle size is reduced to lie between 2 to 7μm and a castable slurry or slip is obtained. A single stage prolonged grinding of the cullet in the medium of the binder and solvent, until the desired particles sizes are obtained, can be used. In the latter case, a filtering step may be necessary to remove oversized particles.

By way of example, a suitable binder is polyvinylbutyral resin with a plasticizer such as dipropylenegycoldibenzoate (e.g. the commercial Benzoflex plasticizer of the Tennessee Products and Chemical Corp.). Other suitable polymers are polyvinyl acetate, selected ones of the acrylic resins, and the like. Similarly other suitable plasticizers such as dioctylphthalate, dibutylphthalate, and the like, can also be used. The purpose of adding an easily evaporable solvent is (1) to initially dissolve the binder so as to enable it to coat the individual glass particles, and (2) to adjust the rheology of the slip of slurry for good castability. Particularly effective solvents for the purpose of this example are the dual solvent systems of U.S. Pat. No. 4,104,245; specifically the dual methanol/methyl isobutylketone (in a ⅜ weight ratio) solvent system.

Step 2

The slip or slurry prepared as in Step 1 is cast, in accordance with conventional techniques, into thin greensheets (e.g. about 75-250μm (3-10 mils thick)), preferably by doctor-blading techniques.

Step 3

The cast sheets are blanked to the required dimensions and via holes are punched through them in the required configuration.

Step 4

A composite metal/glass-ceramic sphere paste composition is produced according to Example 1 and comprises:

| Ingredients | % by weight |
|---|---|
| copper spheres (1-2 μm) | 53.0 |
| glass spheres (3-5 μm) | 28.3 |
| $Al_2O_3$ | 1000 ppm |
| ethyl cellulose | 1.7 |
| wetting agent | 0.5 |
| ester alcohol | 16.5 |
| | 100.00 | an alternate conducting composite via paste is:

| Ingredients | % by weight |
|---|---|
| copper powder (1.35 μm) | 56.70 |
| glass spheres (6 μm) | 25.00 |
| $Al_2O_3$ | 1000 ppm |
| ethyl cellulose | 1.58 |
| 2,2,4-trimethyl-1,3-pentanediol monoisobutyrate | 16.30 |
| wetting agent | 0.42 |
| | 100.00 |

The paste is extruded or screened into the via holes in the individual green dielectric sheets.

Step 5

A suitable conventional copper paste or ink is then screenprinted onto the individual green sheets of Step 4, in the required conductor patterns.

Step 6

A plurality of sheets, prepared as in Step 5, are laminated together in registry in a laminating press.

The temperature and pressure employed for lamination should be such as to cause (1) the individual green sheets to bond to each other to yield a monolithic green substrate, and (2) to cause the green sheet to sufficiently flow and enclose the conductor patterns.

Step 7

Firing of the laminate to the sintering temperatures is undertaken to accomplish binder removal, densification or coalescence of the glass particles, and conversions to a glass-ceramic by crystallization with concurrent sintering of the glass ceramic spheres and the metal particles, in the conductor patterns, vias and individual green sheets. In a typical firing schedule, the green laminate is heated at a rate of 2° C./min. in N₂ to a hold temperature of approximately 750° C. The laminate is held, preferably in moist nitrogen, at this temperature for about 15 hours to burn off the binder. The N₂ ambient is maintained, at which point the heating temperature is again elevated at a rate of 2° C./min. to a hold temperature of about 965° C., which temperature is held for about 3 hours, after which the structure is furnace cooled.

Co-sintering occurs above the glass transition temperature of about 780° C., and causes the via-fill glass and metal spheres to stabilize as a conductive metal skeletal network dispersed in the glass-ceramic matrix which integrates with the glass-ceramic of the dielectric layers to form a hermetic seal therewith.

In summary, applicants have discovered that separations between metal via bodies embedded within ceramic substrate bodies can be avoided by the creation of an integrated interface region between a ceramic matrix containing the metal network of the via body and the ceramic of the substrate body wherein the interface region is a combination of the ceramic compound of the via composition and the ceramic of the insulating or dielectric layers of the substrate body which are cosintered during firing. The ceramic of the conductor composition has a TCE which approximates or is the same as the TCE of the ceramic substrate, and the skeletal structure and/or composition of the conductive metal minimizes or eliminates the expansion differentials between the metal and ceramic materials. Furthermore, the interface region is cosintered, integrated and hermetic. This method produces structures which have a variety of uses; in particular uses as electronic device packaging substrates having embedded conductors which are substantially hermetically isolated from the external environment and substantially free of spaces or voids about conductors.

While the invention has been illustrated and described with respective preferred embodiments, it is to be understood that the invention is not limited to the precise constructions that were disclosed; the right is reserved to all changes and modifications coming within the scope of the invention as defined herein and in the appended claims.

What is claimed is:

1. A circuitized ceramic structure comprising at least one layer of dielectric ceramic composition and at least one via, said at least one via being filled with a conductive via body comprising an electrically conductive skeletal network of a metal contained within a ceramic matrix, said conductive via body being a solid, non-porous mass represented by a major amount by volume of cosintered packed spheres of ceramic material having the spaces therebetween filled with a minor amount by volume of particles of said metal which are smaller in size than said spheres, to form a conductive path, the ceramic composition of said at least one dielectric layer being cosinterable with said ceramic matrix of each said via body, whereby the ceramic matrix is cosintered with and integrated with the at least one dielectric layer in the area of said via to form a hermetic seal between said solid via body and said at least one dielectric layer.

2. A structure according to claim 1 in which the ceramic composition of said at least one dielectric layer and the ceramic matrix of each said via body each comprises a glass containing a crystalline phase.

3. A structure according to claim 1 in which each said via body comprises a cosintered body of spheres of glass-ceramic composition having a substantially uniform sphere diameter which is less than about 10% of the diameter of said via, and in which, said sphere diameter is within the range of from about 0.5μm to about 6μm, and particles of said metal having a maximum dimension less than about one-third to about one-fourth the uniform diameter of said glass-ceramic spheres.

4. A structure according to claim 3 in which said metal particles comprise spheres.

5. A structure according to claim 1 in which said metal comprises copper.

6. A structure according to claim 1 in which said metal comprises a beryllium-containing alloy of copper having greater than 0% and up to 2% by weight beryllium.

7. A structure according to claim 1 in which said metal comprises a mixture of copper and an iron-cobalt alloy, said alloy having a TCE about the same as the ICE of said ceramic material.

8. A structure accorder to claim 7 in which said iron-cobalt alloy is selected from the group consisting of 31wt % nickel, 4 to 6wt % cobalt, balance iron; 36-37wt % iron, 53-55wt % cobalt and 9-10wt % chromium; and 37wt % iron, 30wt % nickel, 25wt % cobalt, 8wt % chromium.

9. A multilayer circuitized ceramic structure comprising at least two insulating layers of dielectric ceramic composition having insulated therebetween a thin electrically-conductive body, said structure having one or more vertical via holes formed through at least one insulating layer present at a surface of said structure and communicating with said electrically-conductive body, characterized by said via hole being filled with a conductive via body comprising an electrically-conductive skeletal network of a minor amount by volume of a metal contained within a major amount by volume of a ceramic matrix, said conductive via body being a solid, non-porous mass represented by cosintered packed spheres of ceramic material having the spaces therebetween filled with particles of said metal which are smaller in size than said spheres, to form a conductive path between the surface of said via body present at a surface of said ceramic circuit structure and said thin electrically-conductive body otherwise insulated between said layers of dielectric ceramic composition, the ceramic composition of said dielectric layers being cosinterable with said ceramic matrix of each said via body, whereby the ceramic matrix is cosintered with and integrated with the dielectric layer in the area of said via hole to form a hermetic seal between said via body and said dielectric layer.

10. A structure according to claim 9 in which the ceramic composition of said dielectric layers and the ceramic matrix of each said via body each comprises glass containing a crystalline phase and having a stable thermal coefficient of expansion.

11. A structure according to claim 9 in which each said via body comprises a cosintered body of spheres of glass-ceramic composition having a substantially uniform sphere diameter which is less than about 10% of the diameter of said via holes, and in which, said sphere diameter is within the range of from about 0.5μm to about 6μm, and particles of said metal having a maximum dimension less than about one-third to about one-fourth the uniform diameter of said glass-ceramic spheres.

12. A structure according to claim 11 in which said metal particles comprise spheres.

13. A structure according to claim 9 in which said metal comprises copper.

14. A structure according to claim 9 in which said metal comprises a beryllium-containing alloy of copper having greater than 0% and up to 2% by weight beryllium.

15. A structure according to claim 9 in which said metal comprises mixture of copper and an iron-cobalt alloy, said alloy having a TCE about the same as the TCE of said ceramic material.

16. A structure according to claim 15 in which said iron-cobalt alloy is selected from the group consisting of 31wt % nickel, 4 to 6wt % cobalt, balance iron; 36–37wt % iron, 53–55wt % cobalt and 9–10wt % chromium; and 37wt % iron, 30wt % nickel, 25wt % cobalt, 8wt % chromium.

17. A cosinterable via-fill paste composition comprising a uniform mixture of (a) a major amount by volume of spheres of ceramic composition having a substantially-uniform average diameter between about 0.5 μm and 6 μm, (b) a minor amount by volume of particles of low-resistive metal having a maximum size between about ⅓ and ¼ the diameter of said ceramic spheres, and (c) a minor amount of an organic binder material in a volatile vehicle, said mixture containing a sufficient volume of said ceramic spheres to form densely packed via fill in which each of said spheres is in surface contact with at least two other spheres and a sufficient volume of said smaller metal particles to fill substantially all of the void spaces surrounding said ceramic spheres, whereby when said uniform mixture of spheres and metal particles is cosintered, there results a solid, substantially non-porous conductive via body comprising a continuous skeletal network of said metal contained within a matrix of ceramic composition.

18. A composition according to claim 17 in which said ceramic composition comprises a glass containing a crystalline phase.

19. A composition according to claim 17 in which said metal particles comprise spheres.

20. A composition according to claim 17 in which said organic binder material comprises ethyl cellulose.

21. A composition according to claim 17 in which said metal comprises copper.

22. A composition according to claim 17 in which said metal comprises a beryllium-containing alloy of copper having greater than 0% and up to 2% by weight beryllium.

23. A composition according to claim 17 in which said metal comprises a mixture of copper and an iron-cobalt alloy, said alloy having a TCE about the same as the TCE of said ceramic material.

24. A composition according to claim 23 in which said iron-cobalt alloy is selected from the group consisting of 31wt % nickel, 4 to 6wt % cobalt, balance iron; 36–37wt % iron, 53–55wt % cobalt and 9–10wt % chromium; and 37wt % iron, 30wt % nickel, 25wt % cobalt, 8wt %.

25. A conducting composite having a thermal coefficient of expansion matched to the thermal coefficient of the expansion of a glass-ceramic layer, comprising a paste containing a mixture of a minor amount by volume of copper particles and a major amount by volume of glass-ceramic spheres having a thermal coefficient of expansion about the same as that of said glass-ceramic layer, said copper particles having a maximum dimension less than about one-third to about one-fourth the uniform diameter of said glass-ceramic spheres.

26. A via-fill composition according to claim 25, in which said copper particles consist essentially of an alloy of copper and a minor amount by weight of beryllium.

27. A via-fill composition according to claim 26 in which said alloy contains from 0% to 2% by weight of beryllium.

28. A via-fill composition according to claim 25 having a thermal coefficient of expansion matched to the thermal coefficient of expansion of glass-ceramic layers containing the via, comprising a mixture of copper and an iron-cobalt alloy.

29. A via fill composition according to claim 28 in which said iron-cobalt alloy has zero thermal coefficient of expansion and comprises 31wt % nickel, 4 to 6wt % cobalt, remainder iron.

30. A via-fill composition according to claim 28 in which said iron-cobalt alloy comprises 36–37wt % iron, 53–55wt % cobalt and 9–10wt % chromium.

31. A via-fill composition according to claim 28 in which said iron-cobalt alloy comprises 37wt % iron, 30wt % nickel, 25wt % cobalt and 8wt % chromium.

* * * * *